(12) United States Patent
Nakahara (10) Patent No.: US 8,717,727 B2
(45) Date of Patent: May 6, 2014

(54) POWER SUPPLY CONTROL APPARATUS INCLUDING OVERCURRENT DETECTION CIRCUIT

(71) Applicant: Renesas Electronics Corporation, Kawasaki (JP)

(72) Inventor: Akihiro Nakahara, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/903,285

(22) Filed: May 28, 2013

(65) Prior Publication Data

US 2013/0258530 A1  Oct. 3, 2013

Related U.S. Application Data

(63) Continuation of application No. 12/656,527, filed on Feb. 2, 2010, now Pat. No. 8,467,165.

(30) Foreign Application Priority Data

Feb. 17, 2009  (JP) .................................. 2009-033670

(51) Int. Cl.
*H02H 3/08* (2006.01)
*H02H 9/02* (2006.01)

(52) U.S. Cl.
USPC ........................................................ 361/93.1

(58) Field of Classification Search
USPC ............................. 361/93.1, 101; 327/77–81
See application file for complete search history.

(56) References Cited

U.S. PATENT DOCUMENTS

| | | | | |
|---|---|---|---|---|
| 4,588,902 | A * | 5/1986 | Yazawa | 327/318 |
| 5,272,392 | A * | 12/1993 | Wong et al. | 327/109 |
| 5,650,737 | A * | 7/1997 | Eilley | 327/108 |
| 5,834,954 | A * | 11/1998 | Tihanyi | 327/77 |
| 5,903,422 | A * | 5/1999 | Hosokawa | 361/93.1 |
| 5,939,991 | A * | 8/1999 | Deng | 340/638 |
| 6,175,478 | B1 * | 1/2001 | Chiozzi et al. | 361/93.1 |
| 6,518,799 | B2 * | 2/2003 | Yoshida | 327/77 |

(Continued)

FOREIGN PATENT DOCUMENTS

JP  2005-39573 A  2/2005

OTHER PUBLICATIONS

Office Action dated Jul. 6, 2012 in U.S. Appl. No. 12/656,527.

(Continued)

*Primary Examiner* — Stephen W Jackson
*Assistant Examiner* — Christopher Clark
(74) *Attorney, Agent, or Firm* — McGinn IP Law Group, PLLC (57) ABSTRACT

A comparator includes a first potential supply terminal, a second potential supply terminal supplying a different potential from that of the first potential supply terminal, a first transistor of a first conductivity type coupled between the first potential supply terminal and a first node, and including a control terminal coupled to a first terminal, a second transistor of the first conductivity type coupled between the first potential supply terminal and a second node, and including a control terminal coupled to a second terminal, a third transistor of a second conductivity type coupled between the first node and a third terminal, and including a control terminal coupled to the second node, and a fourth transistor of the second conductivity type coupled between the second node and the second potential supply terminal, and including a control terminal coupled to the second node.

17 Claims, 7 Drawing Sheets

(56) References Cited

U.S. PATENT DOCUMENTS

| | | | |
|---|---|---|---|
| 6,603,358 B2* | 8/2003 | Shearon et al. | 330/288 |
| 7,006,070 B2* | 2/2006 | Ishiyama | 345/100 |
| 7,336,085 B2* | 2/2008 | Fabbro et al. | 324/713 |
| 7,626,792 B2* | 12/2009 | Mitsuda | 361/93.1 |
| 7,995,319 B2* | 8/2011 | Kojima | 361/93.1 |
| 8,148,962 B2* | 4/2012 | Elran | 323/281 |
| 8,314,638 B2* | 11/2012 | Nakahara | 327/77 |
| 2005/0013079 A1* | 1/2005 | Mitsuda | 361/100 |
| 2006/0132999 A1* | 6/2006 | Kimura | 361/93.1 |
| 2010/0207605 A1* | 8/2010 | Nakahara | 324/140 R |
| 2010/0207665 A1* | 8/2010 | Nakahara | 327/77 |

OTHER PUBLICATIONS

Notice of Allowance dated Feb. 14, 2013 in U.S. Appl. No. 12/656,527.

* cited by examiner

POWER SUPPLY CONTROL APPARATUS INCLUDING OVERCURRENT DETECTION CIRCUIT

CROSS-REFERENCE TO RELATED APPLICATIONS

The present application is a Continuation application of U.S. patent application Ser. No. 12/656,527, filed on Feb. 2, 2010, which is based on and claims priority from Japanese patent application 2009-033670 filed on Feb. 17, 2009, the entire contents of which are incorporated herein by reference.

BACKGROUND

1. Field of the Invention

The present invention relates to a power supply control apparatus including an overcurrent detection circuit.

2. Description of Related Art

In recent years, what is called an IPD (Intelligent Power Device) is used in electronic control systems for vehicle. The IPD includes, as a switch element for driving a load such as a lamp and motor, a control circuit and a switching element such as power MOSFET (Metal-Oxide Semiconductor Field-Effect Transistor) or IGBT (Insulated Gate Bipolar Transistor). In these systems including loads and the IPD, for example, when there occurs a trouble such as terminal short circuit in a terminal of the electronic control system, wiring short circuit or load short circuit, overcurrent may flow through the wire harness and the switching element (power MOSFET or the like) of the IPD, thus causing damage. Thus, as a control circuit for the IPD, a circuit (overcurrent protection circuit) is typically provided which detects overcurrent and turns off the power MOSFET. Here, in order to adequately protect the load and the power MOSFET, there is a need for a high precision power supply control apparatus.

Figure 7:
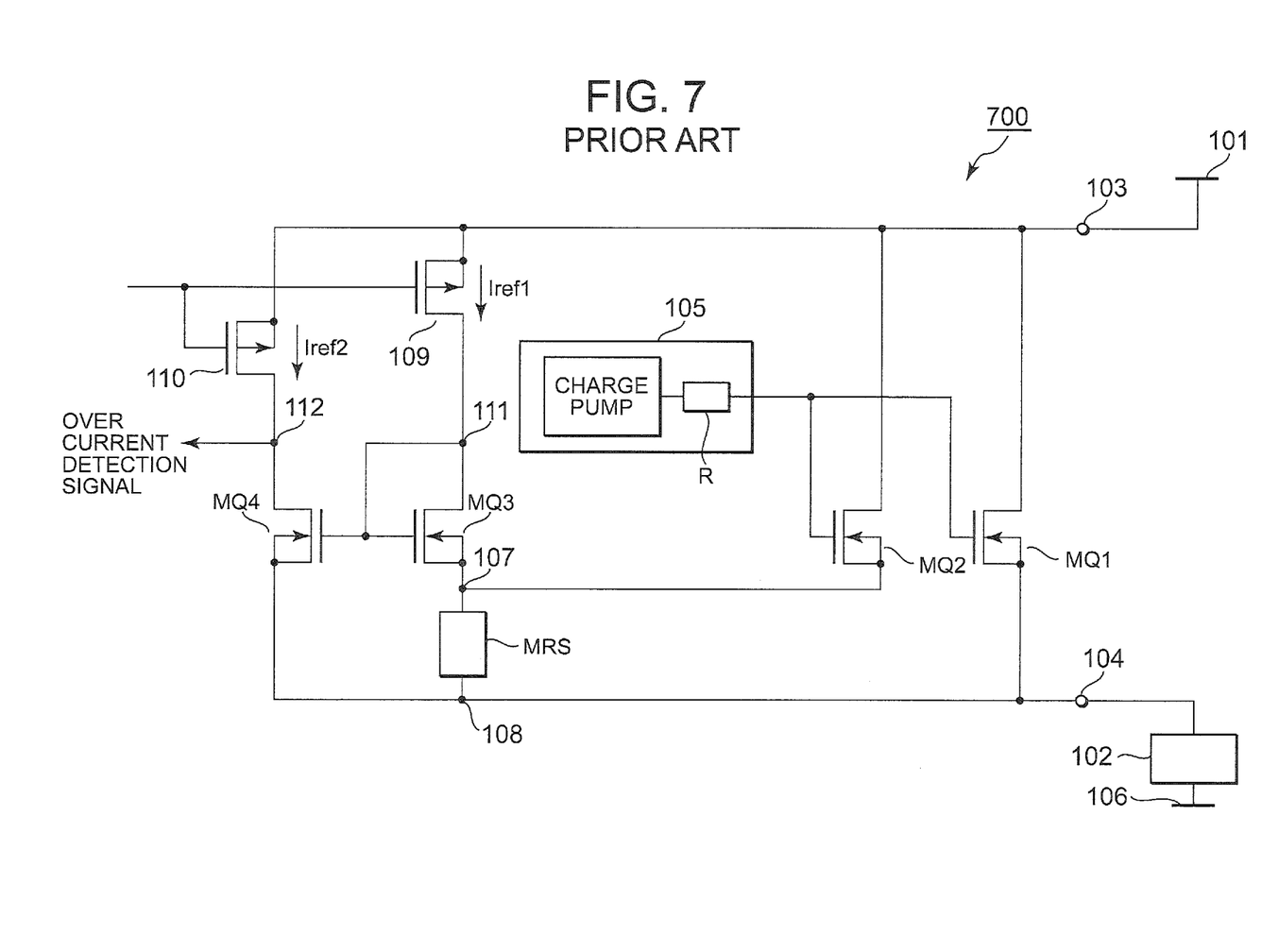
FIG. 7 is a view illustrating a power supply control apparatus 700 including an overcurrent detection circuit according to prior art.

Recently, as a technique for the overcurrent protection circuit, for example, a power supply control apparatus has been proposed which is described in Japanese Patent Laid-Open No. 2005-39573 (Reference 1) and its counterpart, U.S. Patent Application Publication No. 2005/0013079 A1 (Reference 2). FIG. 7 illustrates a power supply control apparatus 700 described in References 1 and 2. The power supply control apparatus 700 includes an output MOS transistor MQ1 used to switch on/off power supplied from a power supply line 101 to a load 102. A drain terminal of the output MOS transistor (power MOSFET) MQ1 is connected to a power source terminal 103 leading to the power supply line 101. A source terminal of the output MOS transistor MQ1 is connected to an output terminal 104 leading to the load 102. A gate terminal of the output MOS transistor MQ1 is connected to a control circuit 105 which outputs a control signal for switching on/off the output MOS transistor MQ1 (or supplies a control voltage to the same). The load 102 is connected to a ground line 106 (for example, a vehicle frame).

The power supply control apparatus 700 further includes a current detection MOS transistor MQ2 which has a structure similar to the output MOS transistor MQ1 (that is, being different only in dimensions and equal in characteristic per unit channel width). The respective drain terminals of the current detection MOS transistor MQ2 and the output MOS transistor MQ1 are connected in common to the power source terminal 103; and the respective gate terminals are connected in common to the control circuit 105. The power supply control apparatus 700 further includes a current detection resistor MRS connected in series between the source terminals of the current detection MOS transistor MQ2 and the output MOS transistor MQ1.

The power supply control apparatus 700 further includes MOS transistors MQ3 and MQ4 which constitute a current mirror. A source terminal of the MOS transistor MQ3 is connected to a connecting node 107 between the current detection resistor MRS and the current detection MOS transistor MQ2. A gate terminal and a drain terminal of the MOS transistor MQ3 are connected in common to a connecting node 111 and also connected to a drain terminal of a MOS transistor 109. A source terminal of the MOS transistor MQ4 is connected to a connecting node 108 between the source terminal of the output MOS transistor MQ1 and the current detection resistor MRS. Further, a gate terminal of the MOS transistor MQ4 is connected in common to the connecting node 111. A drain terminal of the MOS transistor MQ4 is connected via a connecting node 112 to a drain terminal of a MOS transistor 110. The respective gate terminals of the MOS transistors 109 and 110 are connected in common to a bias signal supply source; and the respective source terminals thereof are connected in common to a power source terminal 103. An overcurrent detection signal is extracted from the connecting node 112.

Here, consider a case in which, due to some reason, a line for connecting the load 102 gets loose and causes a short circuit with the vehicle frame, or the terminal 104 in the electronic control system comes into contact with the ground line. In this case, a short circuit is formed via the output MOS transistor MQ1 between the power supply line 101 and the ground line 106, and overcurrent flows through the output MOS transistor MQ1, which is an abnormal state. When such abnormal state occurs, there is a need to turn off the output MOS transistor MQ1, or to suppress the current flowing through the output MOS transistor MQ1, so that the output MOS transistor MQ1 is protected. This overcurrent detection operation will be briefly described below.

The output MOS transistor MQ1 controls switching on/off of a power supply voltage supplied from the power supply line 101 to the load 102. That is, a control signal output from the control circuit 105 controls the connection between the drain terminal and source terminal of the output MOS transistor MQ1. The output MOS transistor MQ1 has a structure similar to the current detection MOS transistor MQ2, so when the current flowing through the output MOS transistor MQ1 increases (10 A, for example), the current flowing through the current detection MOS transistor MQ2 also increases according to the homothetic ratio (10000:1, for example) between the output MOS transistor MQ1 and the current detection MOS transistor MQ2 (for example, 10 A/10000=1 mA). Accordingly, potential Vs at the connecting node 107 and potential V1 at the connecting node 111 rise. Consequently, the current flowing between the drain terminal and source terminal of the MOS transistor MQ4 increases. Here, the MOS transistor MQ3 and the MOS transistor MQ4 have a similar structure.

When the current flowing between the drain terminal and source terminal of the MOS transistor MQ4 exceeds a reference current value Iref2 (50 μA, for example) set by the MOS transistor 110, the overcurrent detection signal output via the connecting node 112 changes from a high level to a low level, so it is determined that the output MOS transistor MQ1 is in an overcurrent state. However, when the current flowing through the output MOS transistor MQ1 is small, the on-current flowing through the MOS transistor MQ4 is smaller than the reference current value Iref2. In this case, the overcurrent detection signal output via the connecting node 112 keeps the high level, so it is determined that the output MOS transistor MQ1 is not in an overcurrent state.

Here, the inventor has found that the power supply control apparatus 700 can be still improved. In the power supply control apparatus 700, overcurrent detection is performed based on a reference current (for example, a current Iref2 flowing through the MOS transistor 110) used as a reference for determining occurrence of overcurrent state and on a current (for example, current flowing through the current detection MOS transistor MQ2) flowing through the output MOS transistor MQ1. Thus, there is a need to adjust the size of the transistors (for example, MOS transistors MQ3 and MQ4, and MOS transistors 109 and 110). That is, the transistors have a structure similar to each other, but are different in size. Accordingly, the transistors are affected by characteristic variations in manufacturing process or by characteristic variations dependent on ambient temperature conditions. Further, effects of bias signal accuracy should be also taken into consideration.

SUMMARY

Aspects of the present invention will be described using reference numbers and characters used in DETAILED DESCRIPTION OF THE PREFERRED EMBODIMENTS. These reference numbers and characters are parenthesized so that the corresponding relationship with DETAILED DESCRIPTION OF THE PREFERRED EMBODIMENTS is clear. However, the reference numbers and characters should not be used for interpretation of the technical scope of the invention described in CLAIM.

An overcurrent detection circuit according to an aspect of the present invention includes: a detection transistor (Q2) which produces a detection current dependent on a current flowing through an output transistor; a first current source transistor (9) which produces a first reference current (Iref1) based on a first control signal; a second current source transistor (10) which produces a second reference current (Iref2) based on a second control signal different from the first control signal; a current mirror circuit which outputs an overcurrent detection signal based on the first reference current (Iref1), the second reference current (Iref1) and the detection current; and a reference voltage production circuit (18) which produces the first control signal and the second control signal. The reference voltage production circuit (18) includes: a resistor (21) arranged between a first output terminal used to output the first control signal and a second output terminal used to the second control signal; and a zener diode (37) connected in parallel with the resistor (21).

A power supply control apparatus according to another aspect of the present invention includes: an output transistor (Q1) which controls a current supplied to a load; a detection transistor (Q2) which produces a detection current dependent on a current flowing through the output transistor; a first current source transistor (9) which produces a first reference current (Iref1) based on a first control signal; a second current source transistor (10) which produces a second reference current (Iref2) based on a second control signal different from the first control signal; a current mirror circuit which outputs an overcurrent detection signal based on the first reference current (Iref1), the second reference current (Iref2) and the detection current; a reference voltage production circuit (18) which produces the first control signal and the second control signal; and a voltage control circuit (5, 15) which supplies a control voltage to a control terminal of the output transistor (Q1) and to a control terminal of the detection transistor (Q2). The reference voltage production circuit (18) includes: a resistor (21) arranged between a first output terminal used to output the first control signal and a second output terminal used to output the second control signal; and a zener diode (37) connected in parallel with the resistor (21).

According to the present invention, the power supply control apparatus is provided which includes the overcurrent detection circuit capable of detecting overcurrent with high accuracy.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be described herein with reference to illustrative embodiments. Those skilled in the art will recognize that many alternative embodiments can be accomplished using the teachings of the present invention and that the invention is not limited to the embodiments illustrated for explanatory purposes.

Specific embodiments to which the present invention is applied will be described in detail below with reference to the drawings. The same reference characters are applied to identical parts in the drawings, and repeated explanation thereof is omitted for clarification of explanation.

Embodiment 1 of the Present Invention

Figure 1:
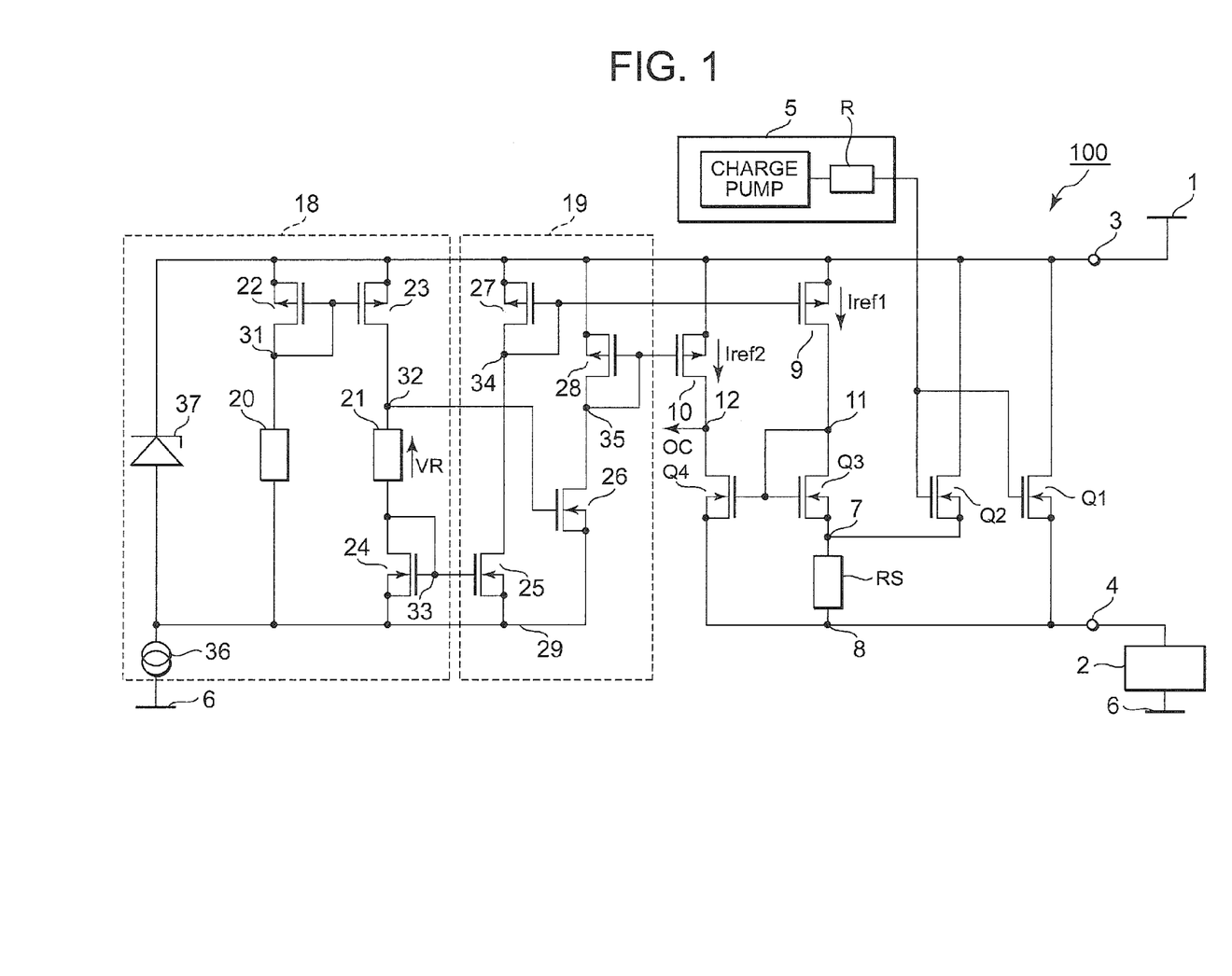
FIG. 1 is a view illustrating a power supply control apparatus 100 including an overcurrent detection circuit according to Embodiment 1 of the present invention.

Embodiment 1 of the present invention will be described with reference to the drawing. A power supply control apparatus 100 including an overcurrent detection circuit according to Embodiment 1 of the present invention is, as illustrated in FIG. 1, an IPD having an overcurrent detection function of protecting an output transistor from overcurrent.

First, the configuration of the circuit illustrated in FIG. 1 will be described. The circuit illustrated in FIG. 1 has a "high-side switch" configuration in which a high-potential side connection terminal 3 of the power supply control apparatus 100 is connected to a power supply line 1 and in which a load 2 is connected between a low-potential side connection terminal 4 of the power supply control apparatus 100 and a ground line 6. The power supply control apparatus 100 includes an output MOS transistor (output transistor) Q1, a voltage control circuit 5 and an overcurrent detection circuit. The voltage control circuit 5 includes, for example, a charge pump circuit and a gate resistor R. The overcurrent detection circuit includes a transistor (first current source transistor) 9 which outputs a constant current Iref1, a transistor (second current source transistor) 10 which outputs a constant current Iref2, a detection MOS transistor (detection transistor) Q2, a transistor (first mirror transistor) Q3, a transistor (second mirror transistor) Q4, a resistor (second resistor) RS, a bias production circuit 19 and a reference voltage production circuit 18. The bias production circuit 19 includes a transistor (first bias transistor) 25, a transistor (second bias transistor) 26, a transistor (third current source transistor) 27 and a transistor (fourth current source transistor) 28. Here, the power supply control apparatus 100 has a function of detecting overcurrent based on current flowing between the drain and source terminals of the output MOS transistor Q1 when a power supply voltage is supplied from the power supply line 1 to the load 2. In the embodiment of the present invention, a case will be described in which the transistors 9, 10, 27 and 28 are each a p-channel type MOS transistor. Also, in the present embodiment of the present invention, a case will be described in which the output MOS transistor Q1, the detection MOS transistor Q2 and the transistors Q3, Q4, 25 and 26 are each an n-channel type MOS transistor. For the convenience of explanation, the voltage supplied from the power supply line 1 is referred to as a power supply voltage 1; and the voltage supplied from the ground line 6 is referred to as a ground voltage 6.

In the power supply control apparatus 100, the output MOS transistor Q1 switches on/off power supply voltage supplied from the power supply line 1 to the load 2. The drain terminal of the output MOS transistor Q1 is connected to the high-potential side connection terminal 3 leading to the power supply line 1. The source terminal of the output MOS transistor Q1 is connected to the low-potential side connection terminal 4 connected to one terminal of the load 2. The gate terminal of the output MOS transistor Q1 is connected to an output terminal of the voltage control circuit 5 which outputs a control signal for switching on/off the output MOS transistor Q1 (or supplies a control voltage to the same). The other terminal of the load 2 is connected to the ground line 6 (for example, a vehicle frame).

The detection MOS transistor Q2 is composed of an element having a structure similar to the output MOS transistor Q1 (that is, being different only in dimensions and equal in characteristic per unit channel width). A drain terminal of the detection MOS transistor Q2 is connected to the high-potential side connection terminal 3. A gate terminal of the detection MOS transistor Q2 is connected to the output terminal of the voltage control circuit 5. The resistor RS is connected in series between the source terminal of the detection MOS transistor Q2 and the source terminal of the output MOS transistor Q1.

The transistors Q3 and Q4 constitute a current mirror. More specifically, a source terminal of the transistor Q3 is coupled to a connecting node 7 between one terminal of the resistor RS and the source terminal of the detection MOS transistor Q2. A gate terminal and drain terminal of the transistor Q3 are connected in common to a connecting node 11. A drain terminal of the transistor 9 is connected in common to the connecting node 11. A source terminal of the transistor Q4 is coupled in common to a connecting node 8 between the source terminal of the output MOS transistor Q1 and the other terminal of the resistor RS. A gate terminal of the transistor Q4 is connected in common to the connecting node 11. A drain terminal of the transistor Q4 is connected to a drain terminal of the transistor 10 via a connecting node 12. The respective source terminals of the transistors 9 and 10 are connected in common to the high-potential side connection terminal 3. An overcurrent detection signal OC is extracted from the connecting node 12.

The transistors Q3 and Q4 are composed of an element having the same size. The term "the same size" as used herein means that the transistors are designed to have the same size and substantially equal in characteristic variation in manufacturing process, temperature characteristic variation and the like (hereinafter, unless particularly specified, referred to as "the same size"). The transistors 9 and 10 are composed of an element having the same size. Further, the transistors 9 and 27 have a structure similar to each other; and the transistors 10 and 28 have a structure similar to each other.

In the bias production circuit 19, a series circuit constituted of the transistors 27 and 25 supplies a bias signal BS1 to a gate terminal of the transistor 9; and a series circuit constituted of the transistors 28 and 26 supplies a bias signal BS2 to a gate terminal of the transistor 10.

The gate terminal of the transistor 9 is coupled to a connecting node 34 between the gate terminal and drain terminal of the transistor 27. The gate terminal of the transistor 10 is coupled to a connecting node 35 between the gate terminal and drain terminal of the transistor 28. The respective source terminals of the transistors 9, 10, 27 and 28 are all connected in common to the high-potential side connection terminal 3.

A drain terminal of the transistor 25 is connected in common to the connecting node 34. A drain terminal of the transistor 26 is connected in common to the connecting node 35. A source terminal of the transistor 25 and a source terminal of the transistor 26 are connected in common to a connecting node 29. A gate terminal of the transistor 25 is connected to a connecting node 33. A gate terminal of the transistor 26 is connected to a connecting node 32. A reference voltage VR having a potential difference VR is given between the connecting nodes 32 and 33.

The reference voltage production circuit 18 includes a resistor (third resistor) 20, a resistor (first resistor) 21, a transistor (third mirror transistor) 22, a transistor (fourth mirror transistor) 23, a transistor 24, a zener diode (first zener diode) 37 and a constant current source 36. In the present embodiment of the present invention, a case will be described in which the transistors 22 and 23 are each a p-channel type MOS transistor. Also, in the present embodiment, a case will be described in which the transistor 24 is an n-channel type MOS transistor. Here, the resistors 20 and 21 are constituted of an element having the same characteristic per unit length.

In the reference voltage production circuit 18, the transistor 22 and the resistor 20 are connected in series with the constant current source 36. More specifically, a source terminal of the transistor 22 is connected to the high-potential side connection terminal 3; a drain terminal thereof is connected via a connecting node 31 to a gate terminal thereof and to one terminal of the resistor 20; the other terminal of the resistor 20 is connected in common to the connecting node 29; and the connecting node 31 is connected to a gate terminal of the transistor 23.

The transistor 23, the resistor 21 and the transistor 24 are connected in series with the constant current source 36. More specifically, a source terminal of the transistor 23 is connected to the high-potential side connection terminal 3; a drain terminal thereof is connected via a connecting node 32 to a gate terminal of the transistor 26 and to one terminal of the resistor 21; the other terminal of the resistor 21 is connected via a connecting node 33 to a drain terminal of the transistor 24, to a gate terminal of the transistor 24 and to a gate terminal of the transistor 25; and a source terminal of the transistor 24 is connected in common to the connecting node 29. The reference voltage VR is given between the connecting nodes 32 and 33.

A cathode terminal of the zener diode 37 is connected to the high-potential side connection terminal 3. An anode terminal of the zener diode 37 is connected to the connecting node 29. The connecting node 29 is also connected to one terminal of the constant current source 36. The other terminal of the constant current source 36 is connected to the ground line 6. The electronic control system including the IPD is usually arranged in a place different from the load 2, so the respective ground voltages are frequently different from each other. In the embodiment of the present invention, a case will be described in which the same ground voltage is supplied to the load 2 and the constant current source 36. When the ground voltage supplied to the power supply control apparatus 100 is different from the ground voltage supplied to the load 2 (that is, the same potential is not provided), also, the content of the following description does not change.

The operation of the power supply control apparatus 100 will be described. The output MOS transistor Q1 and the detection MOS transistor Q2 have a structure similar to each other. Here, in the two transistors, it is assumed that the voltage applied between the gate and source terminals of the output MOS transistor Q1 and that of the detection MOS transistor Q2 are equal to each other, and the voltage applied between the drain and source terminals of the output MOS transistor Q1 and that of the detection MOS transistor Q2 are equal to each other. In this case, a current flows between the drain and source terminals of the detection MOS transistor Q2 according to the homothetic ratio between the detection MOS transistor Q2 and the output MOS transistor Q1 (according to the ratio of channel width therebetween). For example, it is assumed that the homothetic ratio between the output MOS transistor Q1 and the detection MOS transistor Q2 is 1000:1. In this case, a current being 1/1000 of the current flowing through the output MOS transistor Q1 flows through the detection MOS transistor Q2. With this current ratio, for example, when the current flowing between the drain and source terminals of the output MOS transistor Q1 is 10 A, the current flowing between the drain and source terminals of the detection MOS transistor Q2 is 10 mA.

Actually, however, the power supply control apparatus 100 includes the resistor RS. Consequently, the current flowing between the drain and source terminals of the detection MOS transistor Q2 has an difference dependent on a voltage drop by the resistor RS relative to the above current ratio. Accordingly, in the present embodiment, in order to implement an overcurrent detection operation with high accuracy, the voltage drop by the detection resistor RS is preferably minimized (for example, 0.1 V or less).

For example, when a resistance value of 5Ω or so is used as the resistor RS, the voltage drop by the detection resistor RS can be set to 0.05 V or so. Further, when a resistor made of aluminum is used as the resistor RS, the manufacturing tolerance of the resistance value is reduced; that is, overcurrent detection accuracy is raised.

In the power supply control apparatus 100, the transistors Q3 and Q4 have the same size. Further, the resistor RS is arranged at the source of the transistor Q3, so the transistors Q3 and Q4 are different in source potential. Consequently, when the current flowing between the drain and source terminals of the transistor Q3 is different from the current flowing between the drain and source terminals of the transistor Q4, overcurrent detection can be performed using a desired current value. Thus, a current (second reference current) Iref2 flowing between the drain and source terminals of the transistor 10 is controlled by a voltage (second control signal) of the bias signal BS2 applied to the gate terminal of the transistor 10. Further, current (first reference current) Iref1 is controlled by a voltage (first control signal) of the bias signal BS1 applied to the gate terminal of the transistor 9. Thus, the current Iref1 can be adjusted smaller than the current Iref2.

The transistors 9 and 27 constitute a current-mirror connection. Accordingly, the current Iref1 proportional to the current flowing between the drain and source terminals of the transistor 27 flows through the transistor 9. The transistors 10 and 28 constitute a current-mirror connection. Accordingly, the current Iref2 proportional to the current flowing between the drain and source terminals of the transistor 28 flows through the transistor 10.

The potential of the connecting node 34 is determined based on the on-resistance of the transistor 27 and the on-resistance of the transistor 25. And, this potential of the connecting node 34 is applied to the gate terminals of the transistors 9 and 27. The potential of the connecting node 35 is determined based on the on-resistance of the transistor 28 and the on-resistance of the transistor 26. And, this potential of the connecting node 35 is applied to the gate terminals of the transistors 10 and 28.

In the bias production circuit 19, a potential applied to the gate terminal of the transistor 26 is higher than a potential applied to the gate terminal of the transistor 25 by the reference voltage VR. That is, the on-resistance of the transistor 26 is smaller than that of the transistor 25. Consequently, the potential of the connecting node 35 is lower than that of the connecting node 34. Thus, the current Iref1 is greater than the current Iref1. That is, the current Iref1 and the current Iref2 is adjusted based on the reference voltage VR.

First, consider a case in which no current flows between the drain and source terminals of the output MOS transistor Q1 because of OFF control from the voltage control circuit 5. In this case, similarly, no current flows between the drain and source terminals of the detection MOS transistor Q2. Consequently, the potential Vs of the connecting node 7 does not rise; and the potential V1 of the connecting node 11 does not rise. Thus, no current flows between the drain and source terminals of the transistor Q4. Accordingly, an overcurrent detection signal of a high level is output from the connecting node 12. As a result, it is determined that the current flowing through the output MOS transistor Q1 is not in an overcurrent state.

Subsequently, consider a case in which a current flows between the drain and source terminals of the output MOS transistor Q1 because of ON control from the voltage control circuit 5 and in which there is no abnormal state such as short circuit. In this case, assume that a normal current of 6 A flows between the drain and source terminals of the output MOS transistor Q1. Here, assume that when a current greater than 10 A flows between the drain and source terminals of the output MOS transistor Q1, it is determined that there is an abnormal state in which overcurrent flows.

First, a normal current (for example, 6 A) flows between the drain and source terminals of the output MOS transistor Q1. In this case, for example, a current of 6 mA flows, according to the homothetic ratio, between the drain and source terminals of the detection MOS transistor Q2. Thus, the potential Vs of the connecting node 7 and the potential V1 of the connecting node 11 rise relative to the potential of the connecting node 8 by a voltage across the resistor RS. Consequently, when the voltage across the resistor RS rises to a value equal to or greater than a threshold voltage of the transistor Q4, a current flows between the drain and source terminals of the transistor Q4. However, this current does not reach the current Iref2 (for example, 50 μA) flowing between the drain and source terminals of the transistor 10. Consequently, an overcurrent detection signal of a high level is output from the connecting node 12. Accordingly, it is determined that the current flowing through the output MOS transistor Q1 is not in an overcurrent state.

Here, for example, consider a case in which an abnormal state such as short circuit occurs and thus an overcurrent (for example, 11 A) exceeding 10 A flows between the drain and source terminals of the output MOS transistor Q1. In this case, a current of 11 mA flows, according to the homothetic ratio, between the drain and source terminals of the detection MOS transistor Q2. Thus, potential Vs of the connecting node 7 and potential V1 of the connecting node 11 further rises relative to the potential of the connecting node 8 and thus the transistor Q3 turns off. As a result, a current (for example, 55 μA) flows between the drain and source terminals of the transistor Q4. This current exceeds the current Iref2 (for example, 50 μA) flowing between the drain and source terminals of the transistor 10. Consequently, the overcurrent detection signal changes from a high level to a low level. Accordingly, it is determined that the current flowing through the output MOS transistor Q1 is in an overcurrent state.

Here, an overcurrent detection value Ioc (the current value of the overcurrent detection signal output from the connecting node 12) is expressed as the following formula (1).

$$Ioc = \frac{A}{Rs} \cdot \left( \sqrt{B \cdot \frac{\left(\frac{W3}{L3}\right)}{\left(\frac{W4}{L4}\right)}} - 1 \right) \cdot (Vgs1 - Vt) \quad (1)$$

$$= \frac{A}{Rs} \cdot \left(\sqrt{B-1}\right) \cdot (Vgs1 - Vt)$$

In formula (1), character A denotes a ratio of the channel width between the output MOS transistor Q1 and the detection MOS transistor Q2 (that is, Q1/Q2); RS, a resistance value of the resistor RS; B, Iref2/Iref1; L3, a channel length of the transistor Q3; W3, a channel width of the transistor Q3; L4, a channel length of the transistor Q4; W4, a channel width of the transistor Q4; Vgs1, a voltage between the gate and source terminals of the transistor Q3; and Vt, a threshold voltage (MOS threshold value) of the transistors Q3 and Q4.

For Vgs1, the following formula (2) is provided.

$$Vgs1 \propto \sqrt{(Iref1)} \quad (2)$$

From formulas (1) and (2), the following formula (3) is provided.

$$Ioc \propto Vgs1 \propto \sqrt{(Iref1)} \quad (3)$$

That is, a manufacturing tolerance of the overcurrent detection value Ioc is suppressed to the ½ power of a manufacturing tolerance of Iref1.

Here, the transistors Q3 and Q4 have the same size; and the transistors 9 and 10 have the same size. Consequently, it is possible to mutually cancel effects of characteristic variations in manufacturing process or those of characteristic variations dependent on ambient temperature conditions. Consequently, overcurrent detection is performed with high accuracy, compared to prior art.

Using the reference voltage VR, formula (1) can be expressed more simply as the following formula (4).

$$Ioc = A \cdot \frac{VR}{Rs} \quad (4)$$

Formula (4) can be deduced by thinking as follows: for the sake of simplicity, assume that, as for the transistors 25, 26, Q3 and Q4 and the transistors 27, 28, 9 and 10, transistors of the same channel type (for example, n-channel type MOS transistors, or p-channel type MOS transistors) are composed of an element of substantially the same size.

The transistors 27 and 9 constitute a current-mirror connection; consequently, a current of substantially the same value flows between the drain and source terminals of the transistor 25 and between the drain and source terminals of the transistor Q3. The transistors 28 and 10 constitute a current-mirror connection; consequently, when the voltage drop of the resistor RS is equal to the reference voltage VR, a current of substantially the same value flows between the drain and source terminals of the transistor 26 and between the drain and source terminals of the transistor Q4.

In this case, a current detection comparator constituted of the transistors 9, 10, Q3 and Q4 and the resistor RS is in a balanced state. That is, the overcurrent detection signal OC output from the connecting node 12 exhibits a break point in the balanced state. The "break point" means a threshold current value for overcurrent detection; for example, when the potential of the high-potential side connection terminal 3 is VDD and the connecting node 8 is the ground potential, the break point is equal to ½×VDD, for example.

That is, the current detection comparator constituted of the transistors 9, 10, Q3 and Q4 and the resistor RS can be adjusted to a balanced state, based on the reference voltage VR in the bias production circuit 19; thus the threshold current for overcurrent detection can be controlled based on the reference voltage VR.

In this way, in the power supply control apparatus 100 according to the embodiment of the present invention, the transistors Q3 and Q4 are composed of an element having the same size; and the transistors 9 and 10 are composed of an element having the same size. Consequently, the overcurrent detection value Ioc is insensitive to manufacturing tolerance and temperature of the transistors 9 and 10. Similarly, the overcurrent detection value Ioc is insensitive to manufacturing tolerance and temperature of the transistors Q3 and Q4. That is, it is possible to mutually cancel effects of characteristic variations in manufacturing process or characteristic variations dependent on ambient temperature conditions.

Further, the bias signal BS1 applied to the gate terminal of the transistor 9 and the bias signal BS2 applied to the gate terminal of the transistor 10 can be set to a potential different from each other. Consequently, when the transistors 9 and 10 is composed of an element having the same size, also, the current flowing through the transistors can be regulated to a value different from each other. That is, overcurrent detection is performed based on the reference current used as a reference for determining occurrence of overcurrent and on the current flowing through the output MOS transistor Q1, so the size of the transistors 9 and 10 does not need to be adjusted. Consequently, the overcurrent detection value Ioc is insensitive to manufacturing tolerance and temperature of the transistors 9 and 10. Thus, it is possible to mutually cancel effects of characteristic variations in manufacturing process or characteristic variations dependent on ambient temperature conditions. Accordingly, overcurrent detection is performed with high accuracy.

The operation of the reference voltage production circuit 18 will be described. In the reference voltage production circuit 18, the reference voltage VR used to adjust the threshold value for overcurrent detection can be easily set. First, breakdown voltage Vz of the zener diode 37 produces a constant voltage between the high-potential side connection terminal 3 and the connecting node 29. The transistors 22 and 23 constitute a current mirror circuit. Consequently, a current dependent on current flowing through the resistor 20 flows through the resistor 21, thus the reference voltage VR is produced across the resistor 21. This reference voltage VR is expressed as formula (5).

$$VR = \frac{m \cdot R21}{R20} \cdot (Vz - Vgs22) \tag{5}$$

Here, reference character R21 denotes a resistance value of the resistor 21; R20, a resistance value of the resistor 20; m, (W23/L23)/(W22/L22); W23, a channel width of the transistor 23; L23, a channel length of the transistor 23; W22, a channel width of the transistor 22; L22, a channel length of the transistor 22; Vz, a breakdown voltage of the zener diode 37; and Vgs22, a voltage between the gate and source terminals of the transistor 22.

That is, the reference voltage VR is given according to the ratio between the resistors 20 and 21. Here, the resistors 20 and 21 are composed of an element having substantially the same characteristic per unit length. Consequently, the reference voltage VR is insensitive to manufacturing tolerance and temperature of the resistors. Thus, it is possible to mutually cancel effects of characteristic variations in manufacturing process of the resistors 20 and 21 or characteristic variations dependent on ambient temperature conditions. Accordingly, the reference voltage VR is produced with high accuracy.

Further, when the zener diode 37 having a breakdown voltage of 6 V or so is used, a state is produced in which zener breakdown and avalanche breakdown coexist. In this case, it is known that the zener diode has a characteristic insensitive to temperature characteristics of breakdown voltage and to manufacturing tolerance thereof. When such characteristic is used, the reference voltage VR is not affected by effects of the power supply voltage; that is, the reference voltage VR is insensitive to effects of the power supply voltage. Accordingly, the reference voltage production circuit 18 can produce the reference voltage VR with high accuracy. This means that overcurrent detection is performed with high accuracy in the overcurrent detection circuit.

Embodiment 2 of the Present Invention

Embodiment 2 of the present invention will be described with reference to the drawings.

Figure 2:
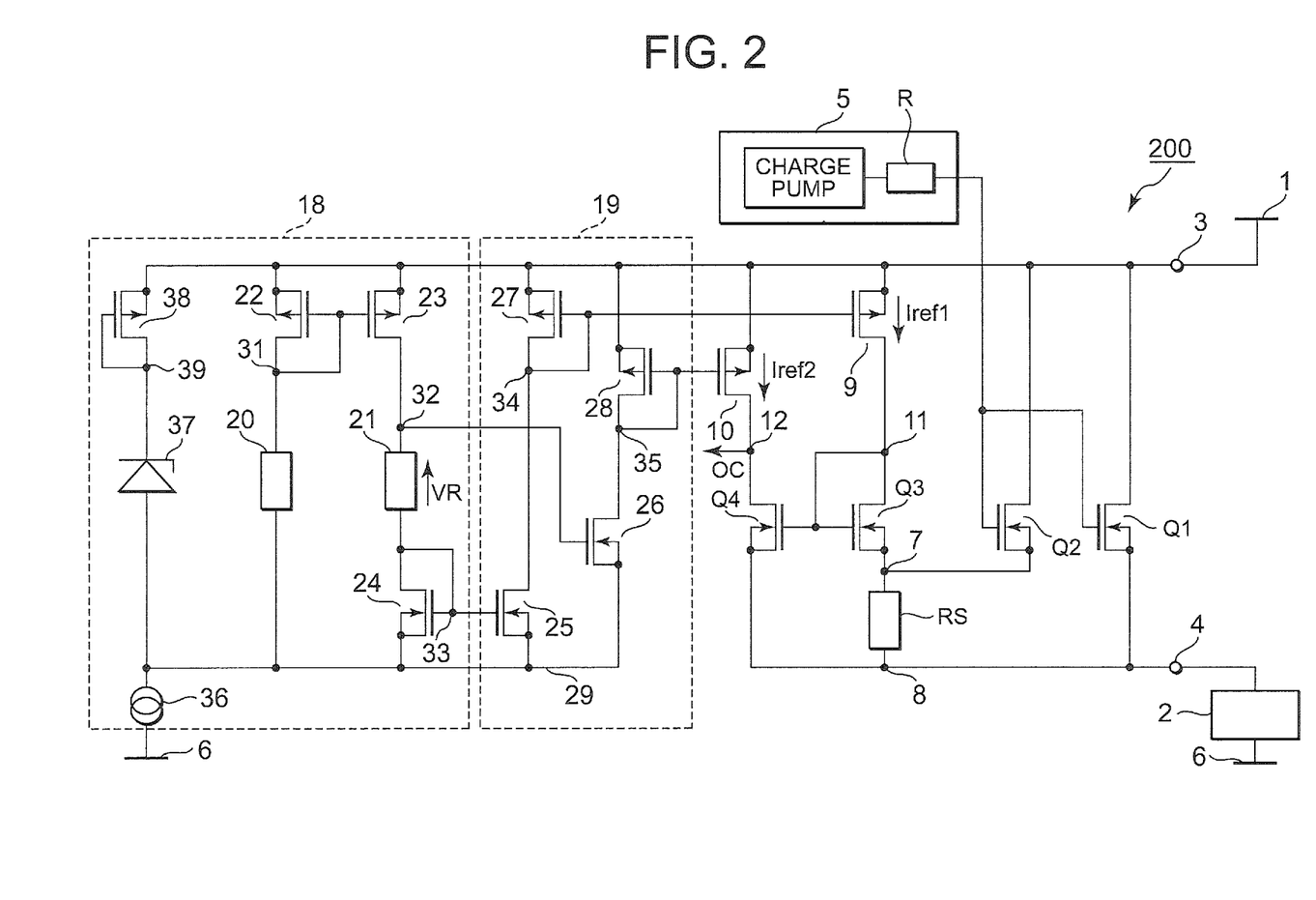
FIG. 2 is a view illustrating a power supply control apparatus 200 including an overcurrent detection circuit according to Embodiment 2 of the present invention.

In a power supply control apparatus 200 according to Embodiment 2 of the present invention, the reference voltage production circuit 18 of the power supply control apparatus 100 illustrated in FIG. 1 further includes a transistor (voltage adjusting transistor) 38 between the high-potential side connection terminal 3 and the cathode terminal of the zener diode 37. In the embodiment of the present invention, a case will be described in which the transistor 38 is a p-channel type MOS transistor.

First, the configuration of the power supply control apparatus 200 illustrated in FIG. 2 will be described. A source terminal of the transistor 38 is connected in common to the high-potential side connection terminal 3. A drain terminal of the transistor 38 is connected via a connecting node 39 to a gate terminal of the transistor 38 and the cathode terminal of the zener diode 37. In terms of the other circuit constituent elements and the operation thereof, the power supply control apparatus 200 is similar to the power supply control apparatus 100 illustrated in FIG. 1 and hence an explanation thereof is omitted.

Here, the transistor 38 may have a size different from the transistor 22, but preferably has substantially the same size. With this circuit configuration, when the reference voltage VR is produced in the reference voltage production circuit 18, the voltage between the gate and source terminals of the transistor 22 can be cancelled. Further, the transistors 38 and 22 mutually cancel effects of characteristic variations in manufacturing process or those of characteristic variations dependent on ambient temperature conditions. That is, the potential difference produced by the zener diode 37 can be applied across the resistor 20. In this case, the reference voltage VR can be expressed as the following formula (6).

$$VR = \frac{m \cdot R21}{R20} \cdot Vz \tag{6}$$

Accordingly, the reference voltage VR produced by the reference voltage production circuit 18 is insensitive to manufacturing tolerance of the transistors 22 and 23. That is, the overcurrent detection value is insensitive to manufacturing tolerance of the transistors 22 and 23. Thus, the reference voltage VR is produced with high accuracy.

Embodiment 3 of the Present Invention

Embodiment 3 of the present invention will be described with reference to the drawings.

Figure 3:
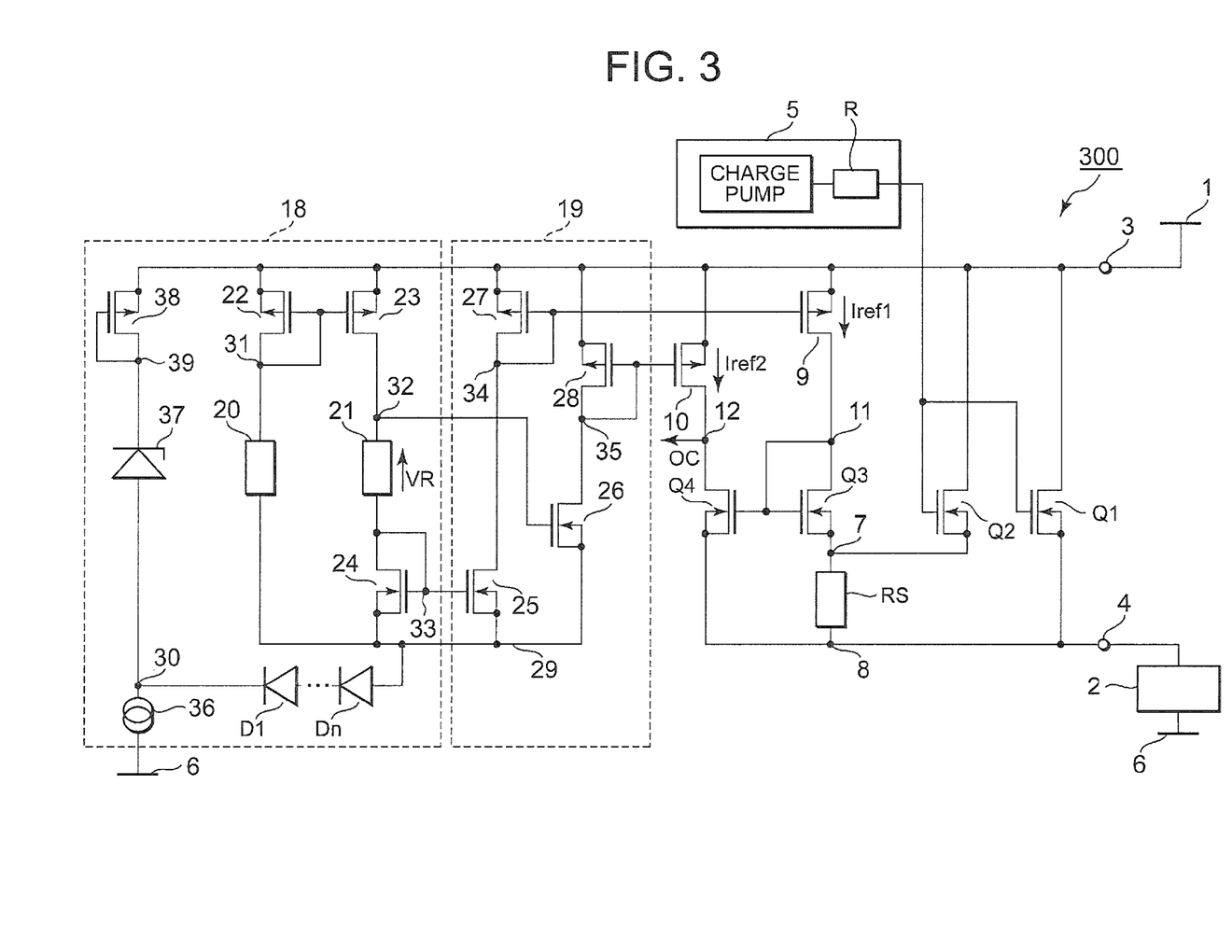
FIG. 3 is a view illustrating a power supply control apparatus 300 including an overcurrent detection circuit according to Embodiment 3 of the present invention.

In a power supply control apparatus 300 according to Embodiment 3 of the present invention, the reference voltage production circuit 18 of the power supply control apparatus 200 illustrated in FIG. 2 further includes, as illustrated in FIG. 3, n-number (n being a natural number) of diodes D1 to Dn connected in tandem between a connecting node 30 between the anode terminal of the zener diode 37 and the one terminal of the constant current source 36, and the connecting node 29.

First, the configuration of the power supply control apparatus 300 illustrated in FIG. 3 will be described. The n-number of diodes D1 to Dn are all connected in series in the same direction. More specifically, a cathode terminal of the diode D1 is connected to the connecting node 30; and an anode terminal of the diode D1 is connected to a cathode terminal of the subsequent stage diode D2. After the diodes have been connected in this way, an anode terminal of the diode Dn is connected to the terminal 29. In this case, the reference voltage VR can be expressed as the formula (7).

$$VR = \frac{m \cdot R21}{R20} \cdot (Vz - n \cdot VF) \tag{7}$$

where character n denotes the number of stages; and VF, a forward voltage of the diode.

In this way, when multiple stages of diodes D1 to Dn are used, the reference voltage VR can be provided with positive temperature dependence. Here, typically, the detection resistor RS has a positive temperature coefficient (6600 ppm/° C. for resistor made of aluminum). Consequently, for example, when three or four stages of diodes D1 to Dn are connected in tandem, adjustment can be made so that temperature characteristics of the detection resistor RS are cancelled. That is, adjustment can be made so that the overcurrent detection value is insensitive to a temperature variation of the detection resistor RS.

Embodiment 4 of the Present Invention

Embodiment 4 of the present invention will be described with reference to the drawings.

Figure 4:
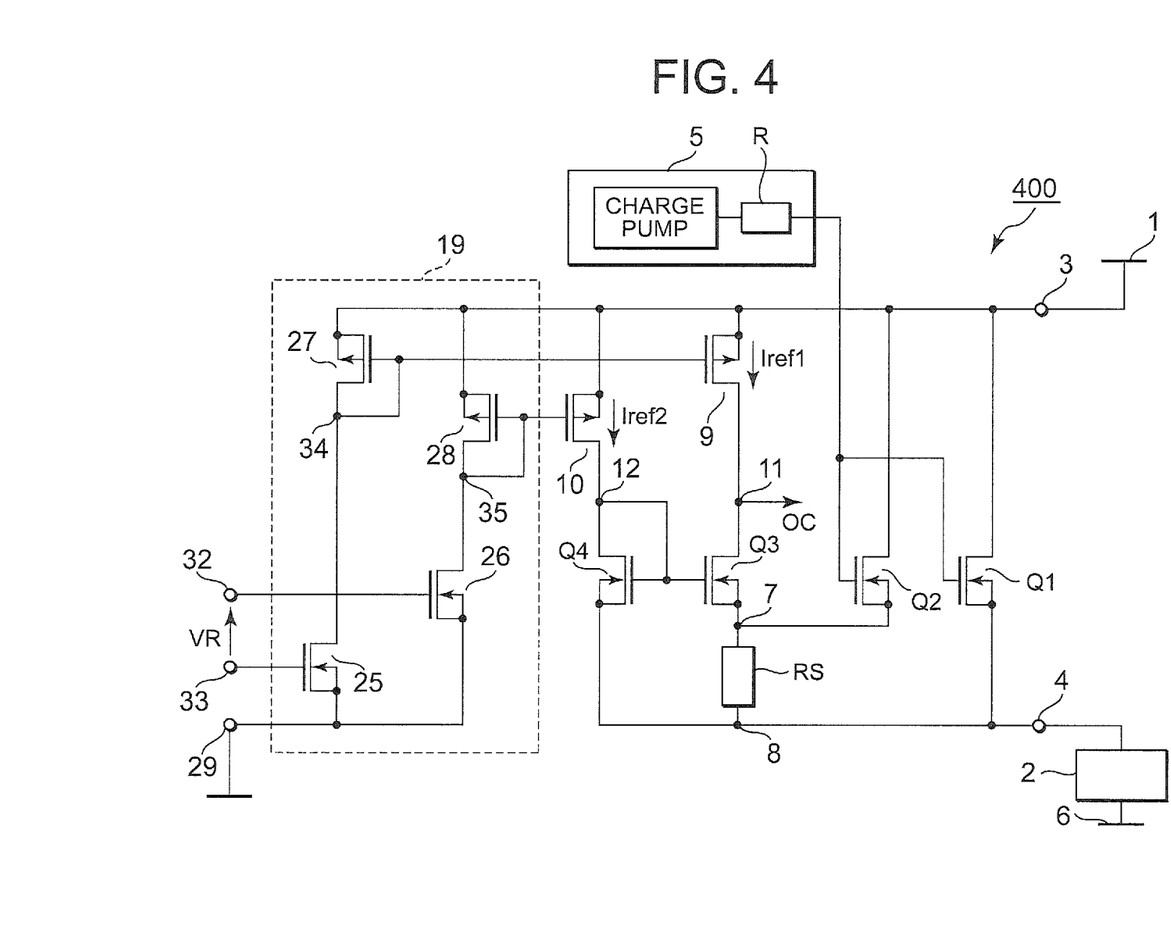
FIG. 4 is a view illustrating a power supply control apparatus 400 including an overcurrent detection circuit according to Embodiment 4 of the present invention.

A power supply control apparatus 400 according to the embodiment of the present invention is, as illustrated in FIG. 4, different from the power supply control apparatus 100 illustrated in FIG. 1 in that: while the respective gate terminals of the transistors Q3 and Q4 are connected to the connecting node 11 in the power supply control apparatus 100, they are connected to the connecting node 12 in the power supply control apparatus 400; and while an overcurrent detection signal is output from the connecting node 12 in the power supply control apparatus 100, an overcurrent detection signal is output from the connecting node 11 in the power supply control apparatus 400. However, the reference voltage production circuit 18 is similar to that of any of the power supply control apparatuses 100 to 300 and hence an illustration thereof is omitted. In terms of the other circuit constituent elements, the power supply control apparatus 400 is similar to any of the power supply control apparatuses 100 to 300 and hence an explanation thereof is omitted.

The operation of the power supply control apparatus 400 illustrated in FIG. 4 will be described. For example, when a current flows between the drain and source terminals of the output MOS transistor Q1, a current dependent on the homothetic ratio flows between the drain and source terminals of the detection MOS transistor Q2. Thus, potential Vs of the connecting node 7 rises according to the amplitude of the current flowing through the detection MOS transistor Q2.

The connecting node 12 has a potential dependent on a voltage drop between the drain and source terminals of the transistor Q4. This voltage drop depends on the current Iref2 flowing through the transistor Q4 having the gate and drain terminals connected in common and between the drain and source terminals of the transistor 10. This potential of the connecting node 12 is supplied to the gate terminal of the transistor Q3.

Here, the current flowing between the drain and source terminals of the transistor Q3 is controlled based on a voltage between the gate and source terminals of the transistor Q3. For example, when potential Vs of the connecting node 7 rises, the voltage between the gate and source terminals of the transistor Q3 lowers. Consequently, the current flowing between the drain and source terminals of the transistor Q3 decreases. Here, when the current flowing between the drain and source terminals of the transistor Q3 is greater than the current Iref1 flowing between the drain and source terminals of the transistor 9 (that is, when a normal current flows), an overcurrent detection signal of a low level is output from the connecting node 11. Accordingly, it is determined that the current flowing through the output MOS transistor Q1 is not in an overcurrent state.

Now, consider a case in which the value of current flowing between the drain and source terminals of the detection MOS transistor Q2 further rises (that is, an overcurrent flows). In this case, potential Vs of the connecting node 7 further rises. Thus, the current flowing between the drain and source terminals of the transistor Q3 further decreases. Here, when the current flowing between the drain and source terminals of the transistor Q3 is smaller than the current Iref1, an overcurrent detection signal of a high level is output from the connecting node 11. Accordingly, it is determined that the current flowing through the output MOS transistor Q1 is in an overcurrent state. That is, in the power supply control apparatus 400, an overcurrent detection signal of a low level is output in a normal state, or an overcurrent detection signal of a high level is output when an overcurrent is detected. In the other aspects of the operation, the power supply control apparatus 400 is similar to any of the power supply control apparatuses 100 to 300 and hence an explanation thereof is omitted. With the above described circuit configuration, advantageous effects are achieved which are similar to those of Embodiments 1 to 3 of the present invention.

Embodiment 5 of the Present Invention

Embodiment 5 of the present invention will be described with reference to the drawings.

Figure 5:
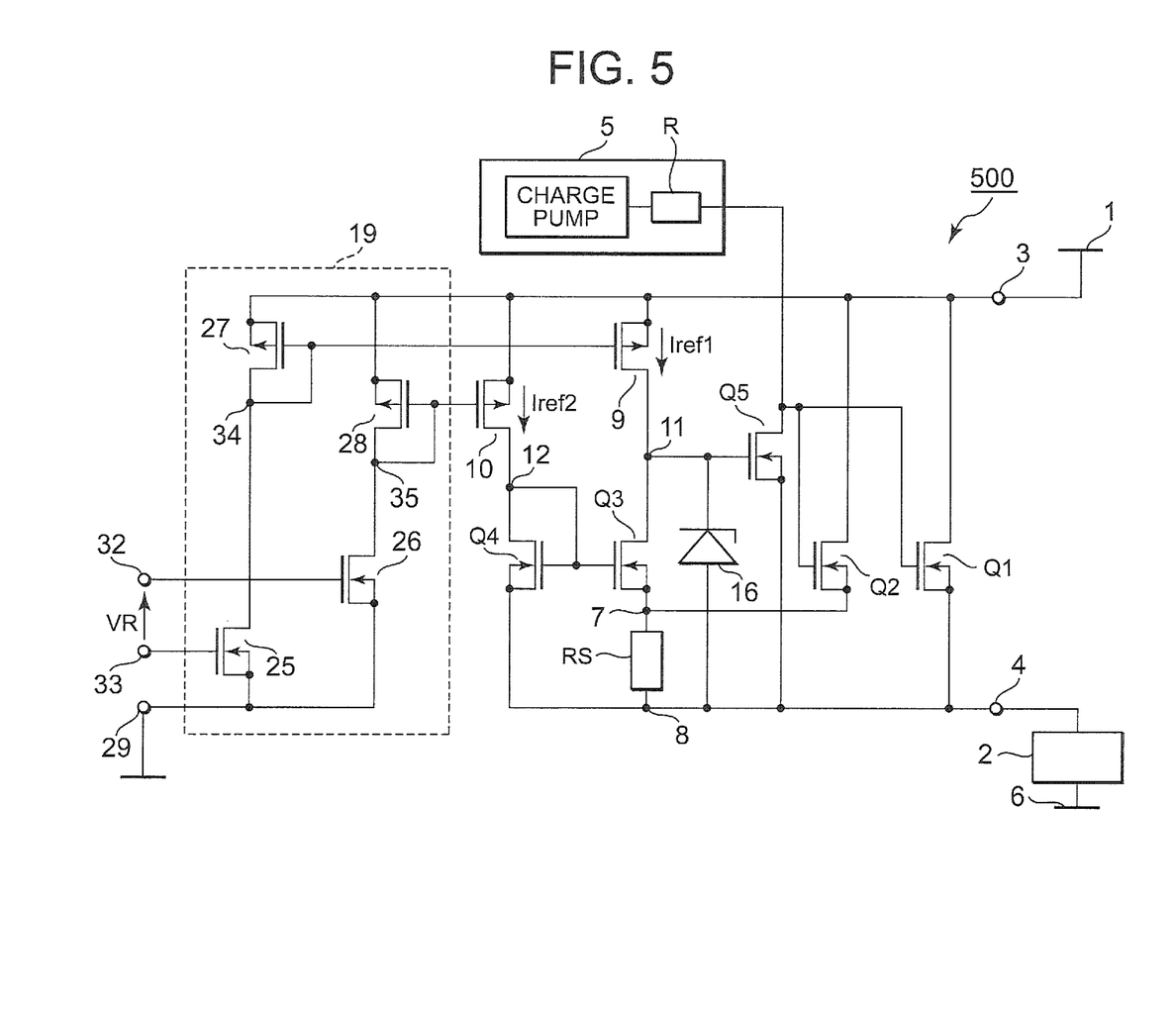
FIG. 5 is a view illustrating a power supply control apparatus 500 including an overcurrent detection circuit according to Embodiment 5 of the present invention.

A power supply control apparatus 500 according to Embodiment 5 of the present invention includes, as illustrated in FIG. 5, an overcurrent protection circuit which suppresses the current flowing through the output MOS transistor Q1 to a given current value when an overcurrent is detected. The power supply control apparatus 500 illustrated in FIG. 5 further includes a transistor (control transistor) Q5 and a zener diode (second zener diode) 16, compared to the power supply control apparatus 400 illustrated in FIG. 4. In the embodiment of the present invention, a case will be described in which the transistor Q5 is an n-channel type MOS transistor. Here, similarly to the power supply control apparatus 400, an illustration of the reference voltage production circuit 18 is omitted.

A source terminal of the transistor Q5 and an anode terminal of the zener diode 16 are both connected to the low-potential side connection terminal 4. A drain terminal of the transistor Q5 is connected to the connecting node between the gate terminal of the output MOS transistor Q1 and the output terminal of the voltage control circuit 5. A gate terminal of the transistor Q5 and a cathode terminal of the zener diode 16 are both connected to the connecting node 11. The zener diode 16 is provided to protect the transistors Q3 and Q4 from overvoltage. Thus, an element of lower-voltage structure can be used for each of the transistors Q3 and Q4. As a result, the area of element can be reduced; and overcurrent detection accuracy can be improved. When an element of higher-voltage structure can be used as the elements forming the transistors Q3 and Q4, there is no need to use the zener diode 16. In terms of the other circuit constituent elements, the power supply control apparatus 500 is similar to the power supply control apparatus 400 and hence an explanation thereof is omitted.

The operation of the power supply control apparatus 500 will be described. In terms of the operation for outputting an overcurrent detection signal from the connecting node 11 and the previous operation thereof, the power supply control apparatus 500 is similar to the power supply control apparatus 400 and hence an explanation thereof is omitted. That is, when a normal current flows between the drain and source terminals of the output MOS transistor Q1, an overcurrent detection signal of a low level is output from the connecting node 11 (the potential of the connecting node 11 is lowered). However, when an overcurrent flows between the drain and source terminals of the output MOS transistor Q1, an overcurrent detection signal of a high level is output from the connecting node 11 (the potential of the connecting node 11 rises).

The power supply control apparatus 500, provided with the transistor Q5, includes a feedback system. Consequently, it is possible to implement stable control for preventing overcurrent from flowing through the output MOS transistor Q1. This operation will specifically be described. When an overcurrent flows between the drain and source terminals of the output MOS transistor Q1, the potential of the connecting node 11 is raised. Consequently, the MOS transistor Q5 exhibits conductive state. As a result, the voltage applied between the gate and source terminals of the output MOS transistor Q1 is decreased. That is, control is performed so that the current flowing between the drain and source terminals of the output MOS transistor Q1 is decreased.

However, when a normal current flows between the drain and source terminals of the output MOS transistor Q1, the potential of the connecting node 11 is lowered. Consequently, the MOS transistor Q5 exhibits less conductive state. Thus, the voltage applied between the gate and source terminals of the output MOS transistor Q1 is increased. That is, control is made so that the current flowing between the drain and source terminals of the output MOS transistor Q1 is increased. When this feedback circuit configuration is used, the current flowing between the drain and source terminals of the output MOS transistor Q1 can be stably controlled.

The invention should not be restrictively interpreted by the description of the embodiment described above. Appropriate modifications to the embodiment are possible without departing from the gist of the invention. For example, in the power supply control apparatus 500 illustrated in FIG. 5, a circuit configuration is described in which an overcurrent detection signal is output from the connecting node 11, but the present invention is not limited thereto. For example, the present invention can also be applied when an overcurrent detection signal is, as in any of the power supply control apparatuses 100 to 300 illustrated in FIGS. 1 to 3, respectively, output from the connecting node 12. In this case, the gate terminal of the transistor Q3 and the gate terminal of the transistor Q4 are connected not to the connecting node 12 but to the connecting node 11 as in any of the power supply control apparatuses 100 to 300. Further, a circuit for inverting the overcurrent detection signal output from the connecting node 12 needs to be arranged between the connecting node 12 and a connecting node between the gate terminal of the transistor Q5 and the cathode terminal of the zener diode 16.

Embodiment 6 of the Present Invention

Embodiment 6 of the present invention will be described with reference to the drawings. The difference of a power supply control apparatus 600 according to Embodiment 6 of the present invention from the power supply control apparatus 400 illustrated in FIG. 4 is as follows: that is, the circuit illustrated in FIG. 4 has a "high-side switch" configuration in which the load 2 is arranged between the low-potential side connection terminal 4 and the ground line 6; but the circuit illustrated in FIG. 6 has a "low-side switch" configuration in which the load 2 is arranged between the power supply line 1 and the high-potential side connection terminal 3 of the power supply control apparatus 600, and the low-potential side connection terminal 4 of the power supply control apparatus 600 is connected to the ground line 6.

Figure 6:
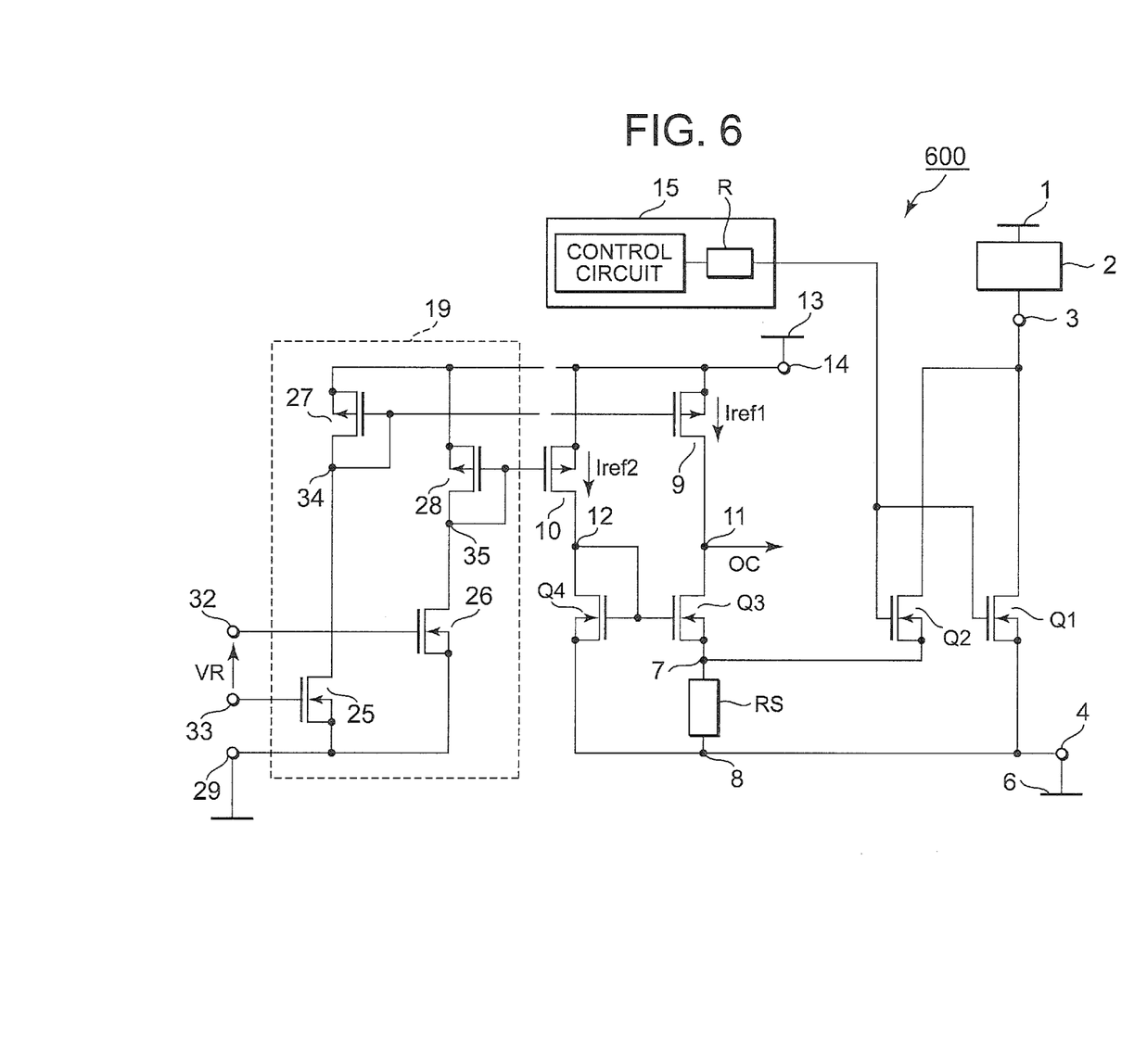
FIG. 6 is a view illustrating a power supply control apparatus 600 including an overcurrent detection circuit according to Embodiment 6 of the present invention.

Further, in the power supply control apparatus 400 illustrated in FIG. 4, the respective source terminals of the transistors 9, 10, 27 and 28 are connected to the high-potential side connection terminal 3; but in the power supply control apparatus 600 illustrated in FIG. 6, these source terminals are connected to a high-potential side connection terminal 14, and the high-potential side connection terminal 14 is connected to a power supply line 13. Further, instead of the voltage control circuit 5, a voltage control circuit 15 is provided which outputs a control voltage suitable for the low-side switch. Here, an illustration of the reference voltage production circuit 18 is omitted. In terms of the other circuit constituent elements, the power supply control apparatus 600 is similar to the power supply control apparatus 400 and hence an explanation thereof is omitted. Further, in terms of the operation, the power supply control apparatus 600 is similar to the power supply control apparatus 400 and hence an explanation thereof is omitted. With this circuit configuration, advantageous effects are achieved which are similar to those of the power supply control apparatus 400.

The power supply control apparatus 600 according to the present embodiment is not limited to the circuit configuration illustrated in FIG. 6, and appropriate modifications to the circuit configuration are, as in any of the embodiments 1 to 5 described above, possible without departing from the gist of the invention. For example, for the power supply control apparatus 600, a circuit configuration has been described in which an overcurrent detection signal is output from the connecting node 11, but a circuit configuration may be used, as in any of the power supply control apparatuses 100 to 300, in which an overcurrent detection signal is output from the connecting node 12. In this case, the gates of the transistors Q3 and Q4 are not connected to the connecting node 12 but to the connecting node 11 as in any of the power supply control apparatuses 100 to 300.

Further, the power supply control apparatus 600 may be modified as in the power supply control apparatus 500 illustrated in FIG. 5, a circuit configuration may be used which further includes an overcurrent protection circuit which suppresses (current-limits) the output MOS transistor Q1 to a given current value when an overcurrent is detected.

In the power supply control apparatuses according to the embodiments described above of the present invention, the transistors Q3 and Q4 are composed of an element having the same size; and the transistors 9 and 10 are also composed of an element having the same size. Consequently, the overcurrent detection value Ioc is insensitive to manufacturing tolerance of the transistors 9 and 10 and to the temperature thereof. Similarly, the overcurrent detection value Ioc is insensitive to manufacturing tolerance of the transistors Q3 and Q4 and to the temperature thereof. That is, it is possible to mutually cancel characteristic variations in manufacturing process of the transistors or characteristic variations dependent on ambient temperature conditions. Accordingly, overcurrent detection can be performed with high accuracy.

In the reference voltage production circuit 18, the resistors 20 and 21 are composed of an element having substantially the same characteristic per unit length. Consequently, the reference voltage VR is insensitive to manufacturing tolerance of these resistors and to the temperature thereof. That is, it is possible to mutually cancel characteristic variations in manufacturing process of the transistors or characteristic variations dependent on ambient temperature conditions. Accordingly, the reference voltage VR can be produced with high accuracy.

Further, when a zener diode 37 having a breakdown voltage of 6 V or so is used, a state is produced in which zener breakdown and avalanche breakdown coexist. In this case, it is known that the zener diode has a characteristic insensitive to temperature characteristics of breakdown voltage and to manufacturing tolerance thereof. When such characteristic is used, the reference voltage VR is not affected by effects of power supply voltage; that is, the reference voltage VR is insensitive to effects of power supply voltage. Accordingly, the reference voltage production circuit 18 can produce the reference voltage VR with high accuracy.

Since the reference voltage production circuit 18 includes multiple stages of diodes D1 to Dn, the reference voltage VR can be provided with positive temperature dependence. Here, typically, the detection resistor RS has a positive temperature coefficient (6600 ppm/° C. for resistor made of aluminum). Consequently, for example, when three or four stages of diodes D1 to Dn are connected in tandem, adjustment can be made so that temperature characteristics of the detection resistor RS are cancelled. That is, adjustment can be made so that the overcurrent detection value is insensitive to a temperature variation of the detection resistor RS.

The invention should not be restrictively interpreted by the description of the embodiments described above. Appropriate modifications to the embodiments are possible without departing from the gist of the invention. For example, in the embodiments, a case was described in which the output transistor and the detection transistor are a MOSFET; but the present invention is not limited thereto and can also be applied to a case in which another switching element such as IGBT is used. Further, for example, in the embodiments described above, a case was described in which the transistors Q3 and Q4 are each an n-channel type MOS transistor; but the present invention is not limited thereto and can also be applied to a case in which the transistors Q3 and Q4 are an NPN bipolar transistor. When a transistor of MOS structure is used, it is known that the relative accuracy thereof is inversely proportional to the square root of the product of channel width and channel length. That is, in raising the relative accuracy of MOS transistors, the area thereof may increase. However, when a bipolar transistor is used, a higher relative accuracy is implemented while a smaller area is occupied.

In the embodiments described above, a case was described in which the bias production circuit 19 is provided; but the present invention is not limited thereto and can also be applied, for example, to a case in which the bias production circuit 19 is not provided. In this case, the connecting node 32 is directly connected to the gate terminal of the transistor 10 and the connecting node 33 is directly connected to the gate terminal of the transistor 9.

In the embodiments described above, a case was described in which the transistors Q3 and Q4 are equal in size and the transistors 9 and 10 are equal in size, but the present invention is not limited thereto. For example, when it is required to suppress only a variation in temperature characteristic of the resistor RS, a circuit configuration may be used in which the reference voltage production circuit 18 is provided, and the transistors Q3 and Q4 are not equal in size and the transistors 9 and 10 are not equal in size.

Although the invention has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A comparator, comprising:
a first potential supply terminal;
a second potential supply terminal supplying a different potential from that of the first potential supply terminal;
a first transistor of a first conductivity type coupled between the first potential supply terminal and a first node, and including a control terminal coupled to a first terminal;
a second transistor of the first conductivity type coupled between the first potential supply terminal and a second node, and including a control terminal coupled to a second terminal;
a third transistor of a second conductivity type coupled between the first node and a third terminal, and including a control terminal coupled to the second node; and
a fourth transistor of the second conductivity type coupled between the second node and the second potential supply terminal, and including a control terminal coupled to the second node,
wherein a reference voltage is supplied between the first terminal and the second terminal, a target voltage is supplied between the third terminal and the second potential supply terminal, and a comparison result signal generated from a comparison between the reference voltage and the target voltage is output from the first node.

2. The comparator as claimed in claim 1, wherein each of the first to fourth transistors comprises a Metal-Oxide Semiconductor (MOS) transistor.

3. The comparator as claimed in claim 2, wherein each of the first and second transistors comprises a PMOS transistor, and each of the third and fourth transistors comprises an NMOS transistor.

4. The comparator as claimed in claim 1, wherein the first and second transistors have a same size.

5. The comparator as claimed in claim 1, wherein the third and fourth transistors have a same size.

6. The comparator as claimed in claim 1, further comprising:
a bias production circuit supplying a potential difference between the first and second terminals which is equivalent to the reference voltage.

7. The comparator as claimed in claim 1, wherein the bias production circuit comprises:
a fifth transistor of the first conductivity type configuring a first current mirror circuit with the first transistor;
a sixth transistor of the first conductivity type configuring a second current mirror circuit with the second transistor;
a seventh transistor of the second conductivity type coupled in series with the fifth transistor; and
an eighth transistor of the second conductivity type coupled in series with the sixth transistor,
wherein the potential difference between the first and second terminals is generated from a voltage supplied between a control terminal of the seventh transistor and a control terminal of the eighth transistor.

8. A current detection circuit, comprising:
a first potential supply terminal;
a second potential supply terminal supplying a different potential from that of the first potential supply terminal;
a first transistor of a first conductivity type coupled between the first potential supply terminal and a first node, and including a control terminal coupled to a first terminal;
a second transistor of the first conductivity type coupled between the first potential supply terminal and a second node, and including a control terminal coupled to a second terminal;
a third transistor of a second conductivity type coupled between the first node and a third terminal, and including a control terminal coupled to the second node;

a fourth transistor of the second conductivity type coupled between the second node and the second potential supply terminal, and including a control terminal coupled to the second node;

a power transistor coupled between a third potential supply terminal and the second potential supply terminal;

a detection transistor coupled between the third potential supply terminal and the third terminal; and a resistive element coupled between the third terminal and the second potential supply terminal, wherein a reference voltage is supplied between the first terminal and the second terminal, a target voltage is generated between the third terminal and the second potential supply terminal, and a comparison result signal generated from a comparison between the reference voltage and the target voltage is output from the first node.

9. The current detection circuit as claimed in claim 8, wherein the first potential supply terminal and the third potential supply terminal are supplied with a same potential, the current detection circuit further comprising a load coupled between the second potential supply terminal and a ground terminal.

10. The current detection circuit as claimed in claim 8, further comprising:
a load coupled between a power supply terminal and the third potential supply terminal.

11. The current detection circuit as claimed in claim 8, wherein each of the first to fourth transistors comprises a Metal-Oxide Semiconductor (MOS) transistor.

12. The current detection circuit as claimed in claim 11, wherein each of the first and second transistors comprises a PMOS transistor, and each of the third and fourth transistors comprises an NMOS transistor.

13. The current detection circuit as claimed in claim 8, wherein the first and second transistors have a same size.

14. The current detection circuit as claimed in claim 8, wherein the third and fourth transistors have a same size.

15. The current detection circuit as claimed in claim 8, further comprising:
a bias production circuit supplying a potential difference between the first and second terminals which is equivalent to the reference voltage.

16. The current detection circuit as claimed in claim 15, wherein the bias production circuit comprises:
a fifth transistor of the first conductivity type configuring a first current mirror circuit with the first transistor;
a sixth transistor of the first conductivity type configuring a second current mirror circuit with the second transistor;
a seventh transistor of the second conductivity type coupled in series with the fifth transistor; and
an eighth transistor of the second conductivity type coupled in series with the sixth transistor,
wherein the potential difference between the first and second terminals is generated from a voltage supplied between a control terminal of the seventh transistor and a control terminal of the eighth transistor.

17. The current detection circuit as claimed in claim 8, further comprising:
a transistor receiving the comparison result signal at a control terminal thereof and controlling a current flowing through the power transistor based on the comparison result signal.

\* \* \* \* \*